(12) United States Patent
Park et al.

(10) Patent No.: US 7,427,547 B2
(45) Date of Patent: Sep. 23, 2008

(54) THREE-DIMENSIONAL HIGH VOLTAGE TRANSISTOR AND METHOD FOR MANUFACTURING THE SAME

(75) Inventors: Sung Kun Park, Cheongju-si (KR); Lee Young Kim, Busan-si (KR)

(73) Assignee: Magnachip Semiconductor, Ltd., ChungCheong, Buk-do (KR)

( * ) Notice: Subject to any disclaimer, the term of this patent is extended or adjusted under 35 U.S.C. 154(b) by 346 days.

(21) Appl. No.: 11/181,561

(22) Filed: Jul. 13, 2005

(65) Prior Publication Data

US 2007/0012995 A1    Jan. 18, 2007

(51) Int. Cl.
*H01L 21/336*    (2006.01)

(52) U.S. Cl. .................. 438/272; 257/E21.41; 438/156

(58) Field of Classification Search ......... 438/151–166, 438/268–272; 257/E21.41
See application file for complete search history.

(56) References Cited

U.S. PATENT DOCUMENTS 6,329,240 B1    12/2001    Hsu et al.
6,417,540 B1    7/2002    Sugihara et al.
2006/0228840 A1*    10/2006    Chau et al. .................. 438/164
2007/0262384 A1*    11/2007    Sato ............................ 257/350

* cited by examiner

*Primary Examiner*—Richard A. Booth
(74) *Attorney, Agent, or Firm*—Marshall, Gerstein & Borun LLP

(57) ABSTRACT

A method for manufacturing a three-dimensional high voltage transistor is disclosed. According to the method, lengths and widths of channels are increased while the reducing transistor forming area on plane, and semiconductor devices are completely separated from each other while restraining parasitic capacitance, latch-up phenomena, and formation of field transistors. The three-dimensional high voltage transistor includes an active area of the three-dimensional high voltage transistor formed in the form of a column on predetermined areas of a Silicon-On-Insulator substrate, source and drain formed in the active areas of the three-dimensional high voltage transistor in the depth direction, a channel area formed between the source and the drain in the depth direction, and a column-shaped gate formed at the side of the channel area on the Silicon-On-Insulator substrate.

7 Claims, 5 Drawing Sheets

THREE-DIMENSIONAL HIGH VOLTAGE TRANSISTOR AND METHOD FOR MANUFACTURING THE SAME

BACKGROUND OF THE INVENTION

1. Field of the Invention

The present invention relates to a method for manufacturing high voltage transistors, and more particularly, to a three-dimensional high voltage transistor manufacturing method capable of increasing the length and width of the channels while reducing transistor forming area in a plane, and completely separating devices from each other while restraining parasitic capacitance, latch-up phenomena, and formation of field transistors.

2. Description of the Related Art

Generally, since high voltage transistors must withstand high voltages, their size is increased, because all items, such as the depths of the junction, the lengths of channel, and the thickness of oxide films of gates, must be able to withstand high voltage.

Thus, in order to manufacture the high voltage transistors, the volume of channel width×(length+length of an active for forming a contact)×depth of a well is required.

Although the area required for forming the high voltage transistor varies depending upon the required breakdown voltage (BV) and electric current, when a BV of about 10V is required, as shown in FIG. 1, the area occupies a large area of channel width×(length+length of an active for forming a contact)×depth of well region=20 μm×(1.5~2 μm+1.1×2)×(1~2 μm)=74~84 μm³.

At that time, the active length for forming the contact is 0.4 μm (contact)+0.35×2(side overlap) and 1.1 μm.

Since problems occur, such as latch-up, parasitic capacitance, and turning-on of the field transistor when the required BV is increased, the channels and the junctions are reinforced by a method using extended drain and deep junction. However, according to the method for reinforcing the channels and the junctions, when the required BV is increased, the occupied area is increased in proportion to the increased BV.

SUMMARY OF THE INVENTION

Therefore, the present invention has been made in view of the above and/or other problems, and it is an object of the present invention to provide a three-dimensional high voltage transistor manufacturing method capable of increasing the length and width of the channels while reducing the transistor forming area in a plane, and completely separating devices from each other while restraining parasitic capacitance, latch-up phenomena, and formation of field transistors.

In accordance with the present invention, the above and other aspects can be accomplished by the provision of a three-dimensional high voltage transistor including an active area of the three-dimensional high voltage transistor formed in the form of a column on predetermined areas of a Silicon-On-Insulator substrate, source and drain formed in the active areas of the three-dimensional high voltage transistor in the depth direction, a channel area formed between the source and the drain in the depth direction, and a column-shaped gate formed at the side of the channel area on the Silicon-On-Insulator substrate.

Preferably, the gate is formed at both sides of the active area of the three-dimensional high voltage transistor.

Another object of the present invention is achieved by the provision of a method for manufacturing a three-dimensional high voltage transistor comprising the steps of 1) defining an active area of the three-dimensional high voltage transistor by forming a trench in a single crystal silicon layer on a silicon-on-insulator substrate, 2) filling oxide in the trench and depositing the oxide, 3) forming a source and a drain at a predetermined area of the active area of the three-dimensional high voltage transistor, and 4) forming a gate at one side of the active area of the three-dimensional high voltage transistor.

Preferably, the trench is formed by dry etching using the silicon-on-insulator substrate as an etch-stop layer.

The active area of the three-dimensional high voltage transistor includes a structure of a single crystal layer remained after forming the trench.

The source and the drain are formed by ion injection process while varying ion injection energy such that the source and the drain have uniform doses in the depth direction.

The gate is formed at both sides of the active area of the three-dimensional high voltage transistor.

Preferably, the gate is formed by the sub-steps of a) removing a predetermined area of the oxide present at a side of the active area by dry etching the predetermined area, b) forming a gate oxidization layer with a predetermined thickness on the predetermined area where the oxide is removed by performing gate-oxidization upon the product manufactured by the dry etching in the above sub-step, and c) filling gate material in the predetermined area, depositing the gate material, and flattening the predetermined area.

Preferably, the gate material comprises poly-silicon or metal such as tungsten.

BRIEF DESCRIPTION OF THE DRAWINGS

These and/or other aspects and advantages of the present invention will become apparent and more readily appreciated from the following description of the embodiments, taken in conjunction with the accompanying drawings, in which.

DESCRIPTION OF THE PREFERRED EMBODIMENTS

Hereinafter, the preferred embodiments of the present invention will be described in detail with reference to the accompanying drawings. It is understood that the preferred embodiments of the present invention are provided as examples of the present invention and the scope of the present invention is not limited by the preferred embodiments of the present invention.

Figure 1:
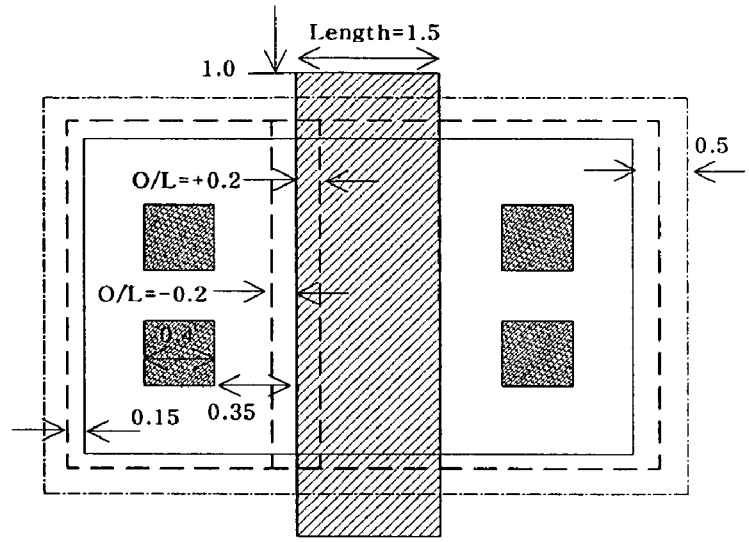
FIG. 1 is a sectional view illustrating a conventional high voltage transistor.
Figure 1:
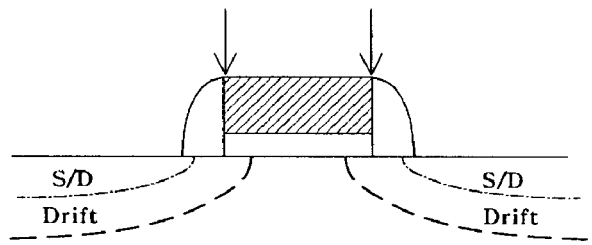
Figure 2:
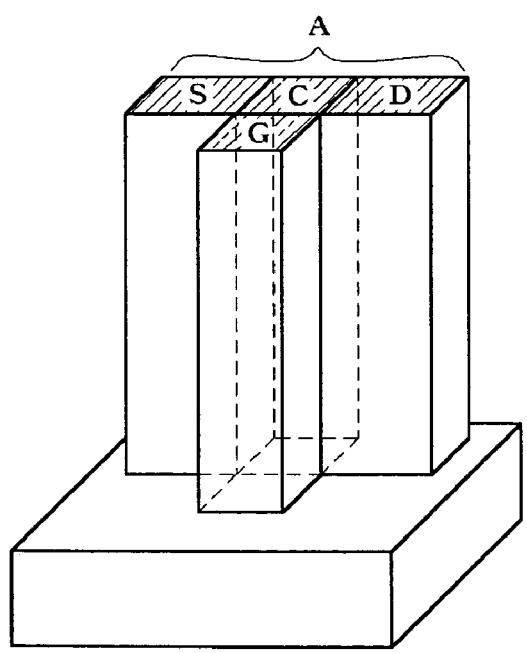
FIG. 2 is a view illustrating a three-dimensional high voltage transistor according to a preferred embodiment of the present invention.

FIG. 2 is a view illustrating a three-dimensional high voltage transistor according to a preferred embodiment of the present invention.

The three-dimensional high voltage transistor according to the preferred embodiment of the present invention includes an active area A of a high voltage transistor formed in the form of a column in a predetermined area on a silicon-on-insulator (SOI) substrate, source S and drain D formed in the active area A of the high voltage transistor in the depth direction, a channel area C formed between the source C and the drain D in the depth direction, and a column-shaped gate G formed at a side of the channel area C on the silicon-on-insulator substrate.

FIGS. 3a to 3f are views illustrating a method for manufacturing the three-dimensional high voltage transistor according to the preferred embodiment of the present invention.

Figure 3A:
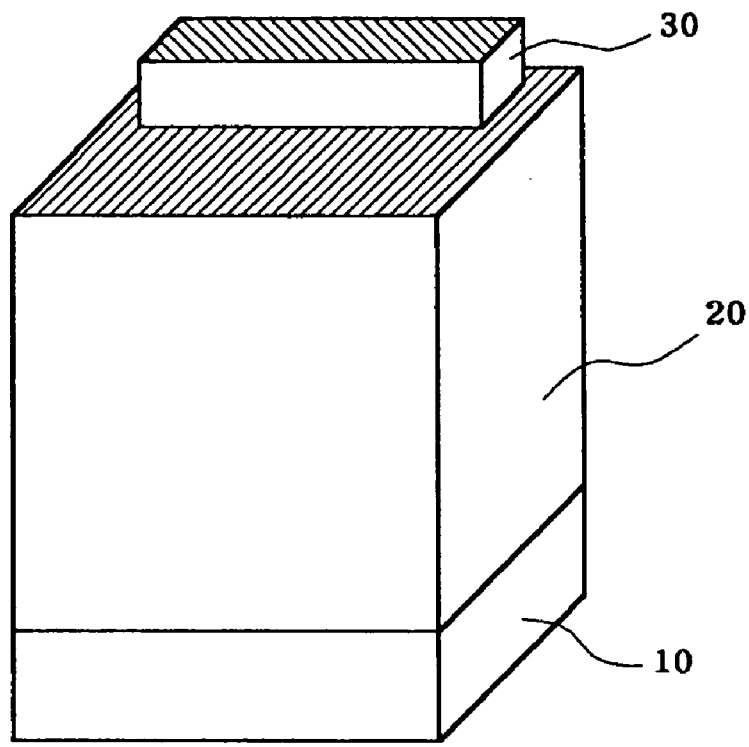
FIGS. 3a to 3f are views illustrating a method for manufacturing the three-dimensional high voltage transistor according to the preferred embodiment of the present invention.

First, as shown in FIG. 3a, a photo-resist 30 is coated on the region where an active area 20' (See FIG. 3b) of the high voltage transistor will be formed on a single crystal silicon layer 20 on the Silicon-On-Insulator substrate 10.

Figure 3B:
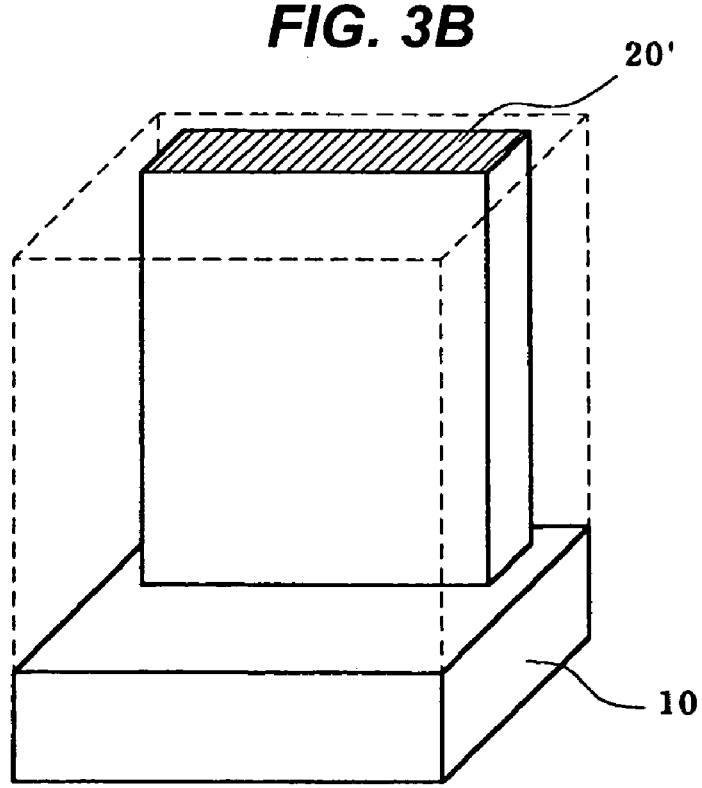

After that, as shown in FIG. 3b, by performing dry-etching using the photo-resist 30, trenches are formed on the single crystal silicon layer 20 except for the active area 20' of the high voltage transistor to form the active area 20' of the high voltage transistor.

In this case, dry etching is performed using the Silicon-On-Insulator substrate 10 as an etch-stop layer.

Figure 3C:
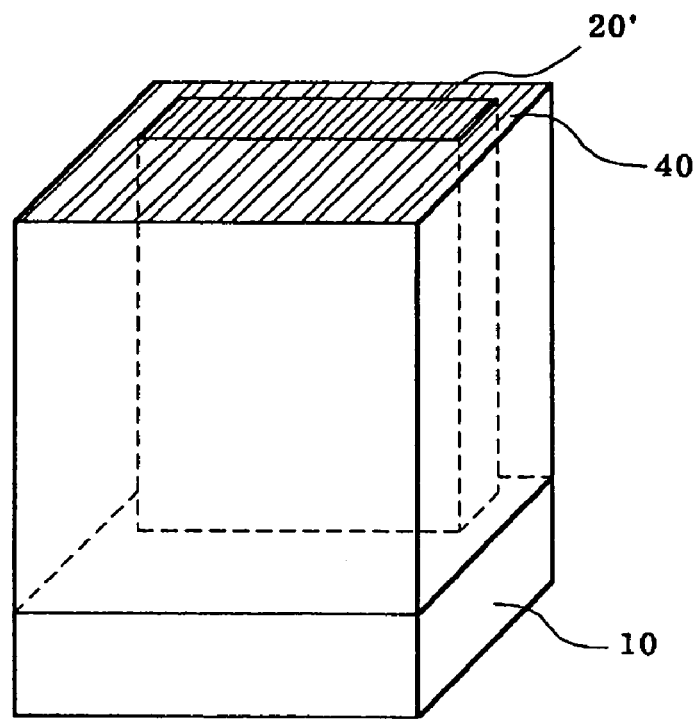

Next, as shown in FIG. 3c, the trenches except for the active area 20' of the high voltage transistor are filled by depositing oxide 40 thereupon so that device separation regions are formed such that devices of the high voltage transistor are completely separated from each other.

Figure 3D:
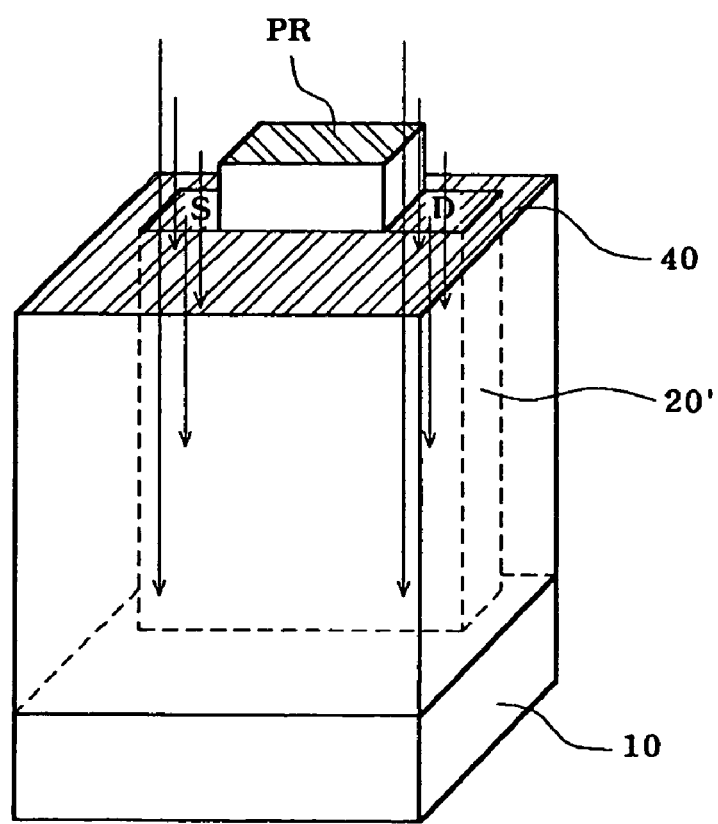

As shown in FIG. 3d, regions where the source and the drain in the active area 20' of the high voltage transistor are coated with opened photo-resist and an ion injection process is performed by using the photo-resist to form the source S and the drain D.

At that time, the ion injection process while varying ion injection energy such that dose distribution is uniform in the depth direction.

Figure 3E:
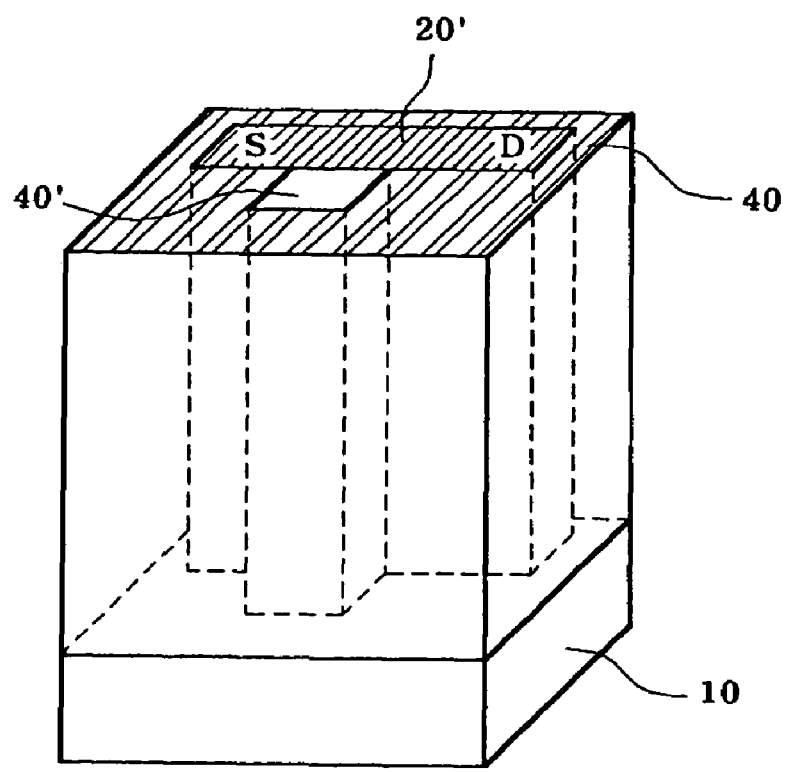

Next, as shown in FIG. 3e, the predetermined area of the oxide 40 for separating the devices at the side of the active area 20' of the high voltage transistor is removed by performing the dry etching to define a gate forming area 40'.

Figure 3F:
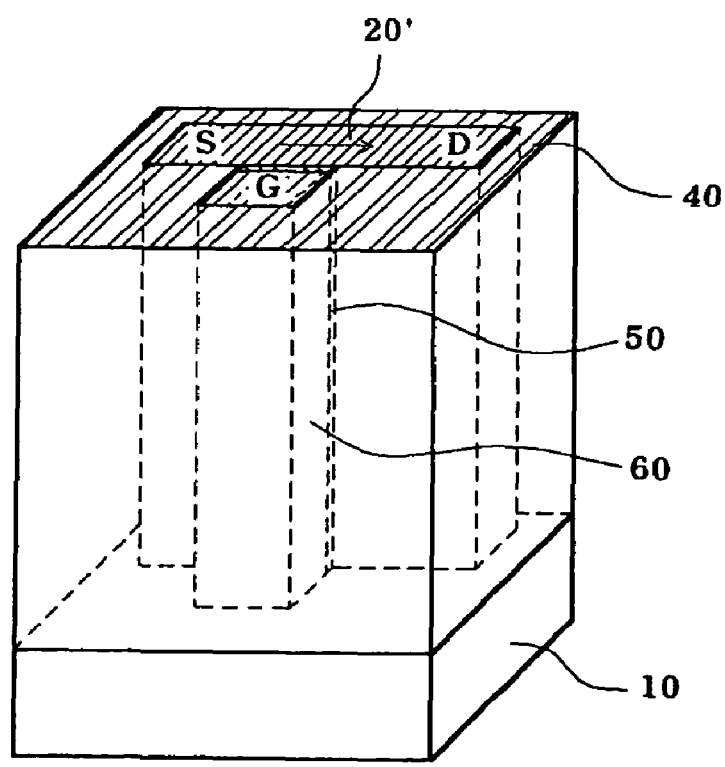

Continuously, as shown in FIG. 3f, the product manufactured by the dry etching is oxidized in a manner of gate oxidization to form a gate oxidization layer 50 with a predetermined thickness in the predetermined area.

The predetermined area, where the gate oxidization layer 50 is formed, is gap-filled with gate material 60 to form the gate of the high voltage transistor.

As the gate material, poly-silicon and metal such as tungsten W may be used.

Next, the gate material 60 is flattened via chemical mechanical polishing (CMP) to complete the three-dimensional high voltage transistor.

Moreover, in an alternative preferred embodiment of the present invention, the gate of the high voltage transistor is formed at both sides of the active area of the high voltage transistor so that current characteristics and response characteristics are enhanced.

Figure 4:
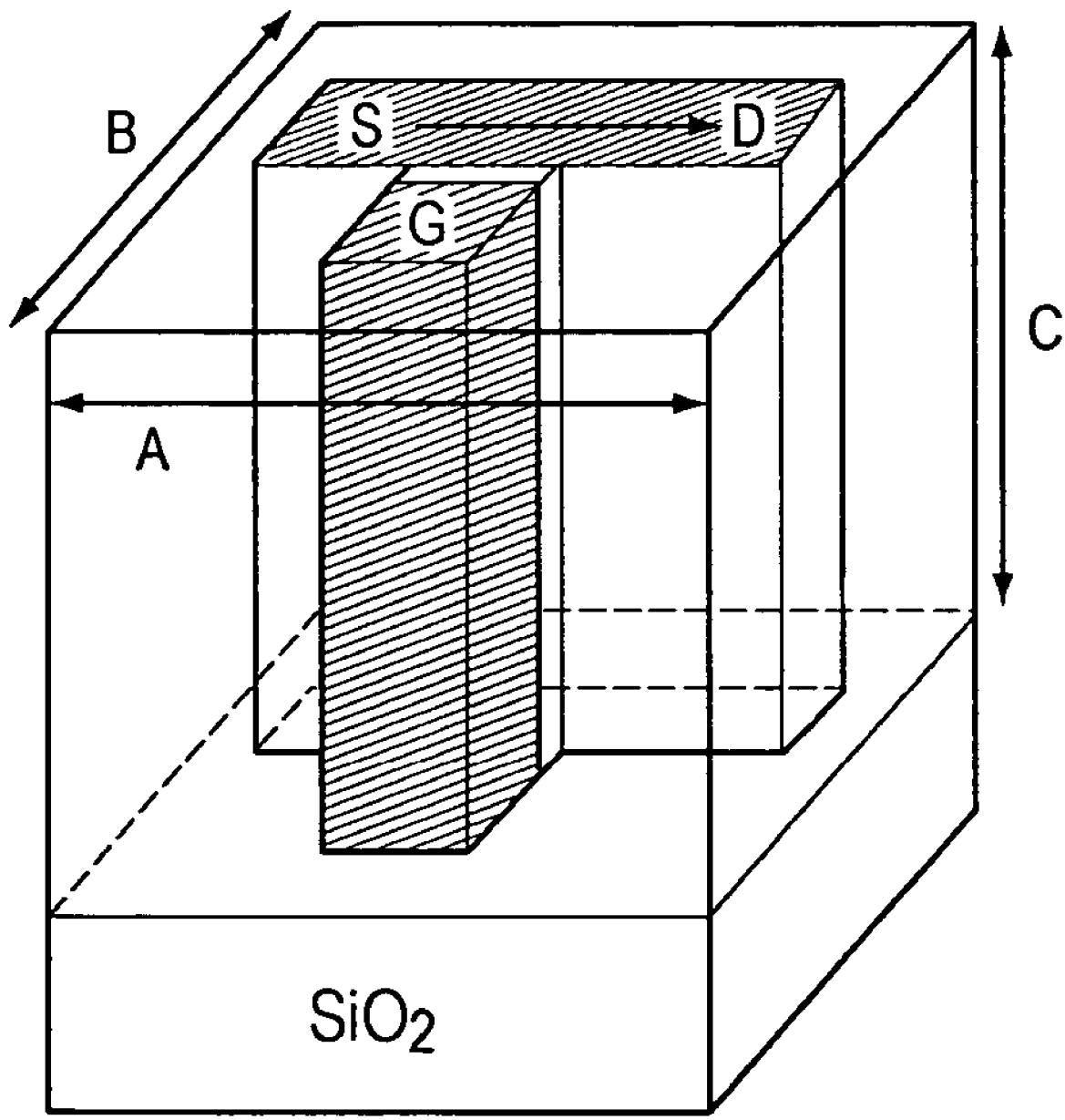
FIG. 4 is a view illustrating an occupied area of the three-dimensional high voltage transistor according to the preferred embodiment of the present invention.

FIG. 4 is a view illustrating the occupied area of the three-dimensional high voltage transistor according to the preferred embodiment of the present invention.

As shown in FIG. 3, A represents the gate length+the active area for forming the contact+device separation area, B represents channel thickness+the gate height+the device separation area, and C represents the channel width.

For example, assuming the distance for separation of the devices between the high voltage transistors is 2 μm, the occupied area of the high voltage transistor needed to drive the conventional high voltage transistor occupies a volume of channel width×(length+length of an active for forming a contact)×depth of well region=20 μm×(1.5~2 μm+1.1×2)×(1~2 μm)=74~84 μm³.

On the contrary, the occupied area of the high voltage transistor needed to drive the high voltage transistor according to the preferred embodiments of the present invention occupies a volume of channel width×(length+length of an active for forming a contact)×depth of well region (channel thickness+both device separation areas)=(1.5~2 μm+1.1×2)× (2+2 μm)=14.7~15.2 μm³, and occupies about ⅕ of the occupied area of the conventional high voltage transistor.

At that time, the area ratio becomes small as the required BV becomes larger.

As described above, according to the three-dimensional high voltage transistor and the manufacturing method thereof, a three-dimensional high voltage transistor having uniform channel width in the depth direction can be formed using the Silicon-On-Insulator substrate, and the parasitic device effect such as the parasitic capacitance, the latch-up, and the like are completely removed.

Moreover, according to the three-dimensional high voltage transistor of the present invention, the Silicon-On-Insulator having a bottom surface separated by an insulator layer is used and all regions except for areas for forming transistors are filled with oxide, so that the semiconductor devices are completely separated and the field transistors occurring in two-dimensional planar transistors are prevented from forming.

As described above, according to the present invention, by forming three-dimensional lateral channel transistors, areas for forming transistors in a plane are reduced and it is possible to increase the channel length and the channel width.

Moreover, in the three-dimensional high voltage transistor according to the present invention, since the Silicon-On-Insulator substrate is used as an etch-stop layer when forming the active area of the three-dimensional high voltage transistor, a uniform depth along channel width having can be formed and the parasitic capacitance and the latch-up phenomena can be prevented.

In addition, in the three-dimensional high voltage transistor according to the present invention, since the Silicon-On-Insulator substrate is used and the lateral channel transistors are formed, the field transistors present in the planar-structure transistors can be prevented from forming.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a three-dimensional high voltage transistor comprising the steps of:
    defining an active area of the three-dimensional high voltage transistor by forming a trench in a single crystal silicon layer on a Silicon-On-Insulator substrate;
    forming an isolation layer enclosing the active area by filing an oxide in the trench;
    forming a source and a drain in the active area, wherein the source and the drain are spaced apart from each other to a predetermined space;
    removing the isolation layer at a side of the active area between the source and the drain;
    forming a gate oxide layer on an exposed surface of the active where the isolation layer is removed; and
    filling a gate material where the isolation layer is removed.

2. The method for manufacturing a three-dimensional high voltage transistor as set forth in claim 1, wherein the trench is formed by dry etching using the Silicon-On-Insulator substrate as an etch-stop layer.

3. The method for manufacturing a three-dimensional high voltage transistor as set forth in claim 1, wherein the active area comprises a column structure of a single crystal layer remained after forming the trench.

4. The method for manufacturing a three-dimensional high voltage transistor as set forth in claim 1, wherein the source and the drain are formed by ion injection process while varying ion injection energy such that the source and the drain have uniform doses in the depth direction.

5. The method for manufacturing a three-dimensional high voltage transistor as set forth in claim 1, wherein the gate is formed at both sides of the active area of the three-dimensional high voltage transistor.

6. The method for manufacturing a three-dimensional high voltage transistor as set forth in claim 1, wherein the step of removing the isolation layer comprises a dry etching.

7. The method for manufacturing a three-dimensional high voltage transistor as set forth in claim 1, wherein the gate material comprises poly-silicon or metal such as tungsten.

* * * * *

UNITED STATES PATENT AND TRADEMARK OFFICE
CERTIFICATE OF CORRECTION

PATENT NO.        : 7,427,547 B2                                    Page 1 of 1
APPLICATION NO.   : 11/181561
DATED             : September 23, 2008
INVENTOR(S)       : Sung K. Park et al.

It is certified that error appears in the above-identified patent and that said Letters Patent is hereby corrected as shown below:

In the Claims:

At Column 4, line 62, "active where" should be -- active area where --.

Signed and Sealed this

Sixth Day of January, 2009

JON W. DUDAS
*Director of the United States Patent and Trademark Office*